United States Patent [19]

Fink

[11] Patent Number: 5,719,526
[45] Date of Patent: Feb. 17, 1998

[54] INTERNAL LOAD MONITOR FOR AMPLIFIER

[75] Inventor: Dennis Fink, Warwick, N.Y.

[73] Assignee: Crest Audio, Inc., Paramus, N.J.

[21] Appl. No.: 558,386

[22] Filed: Nov. 16, 1995

Related U.S. Application Data

[63] Continuation of Ser. No. 336,828, Nov. 9, 1994, abandoned.

[51] Int. Cl.⁶ .............................. H03F 1/34; G01R 19/00
[52] U.S. Cl. .............................. 330/2; 324/713; 330/65;
330/102; 330/105; 381/58; 381/121
[58] Field of Search .............................. 330/2, 65, 68,
330/102, 105, 207 P, 298; 381/58, 88, 120,
121, 59, 16; 324/713

[56] References Cited

U.S. PATENT DOCUMENTS

| | | |
|---|---|---|
| 3,102,241 | 8/1963 | Johnstone ................................ 330/298 |
| 3,974,438 | 8/1976 | Alves, III . |
| 4,049,930 | 9/1977 | Fletcher et al. ................... 330/2 X |
| 4,061,891 | 12/1977 | Pommer ............................ 381/58 |
| 4,092,692 | 5/1978 | Smith et al. ................. 330/207 P X |
| 4,216,517 | 8/1980 | Takahashi ................ 330/207 P X |
| 4,335,384 | 6/1982 | Roos . |
| 4,510,454 | 4/1985 | Sherman . |
| 4,547,740 | 10/1985 | Nilsson . |
| 4,556,841 | 12/1985 | Carlson . |
| 4,683,591 | 7/1987 | Dawson et al. ............. 381/58 X |
| 4,785,419 | 11/1988 | Huffman . |
| 4,868,516 | 9/1989 | Henderson et al. . |
| 4,987,385 | 1/1991 | Engelmann . |
| 5,006,812 | 4/1991 | Erickson . |
| 5,059,923 | 10/1991 | Petty et al. . |
| 5,127,059 | 6/1992 | Elion et al. . |
| 5,285,500 | 2/1994 | Mantz . |
| 5,339,362 | 8/1994 | Harris . |
| 5,400,406 | 3/1995 | Heline, Jr. et al. ............ 381/58 |
| 5,495,178 | 2/1996 | Cheng ..................... 324/713 X |

FOREIGN PATENT DOCUMENTS

| | | | |
|---|---|---|---|
| 446945 | 9/1991 | European Pat. Off. .......... 330/2 |
| 5410648 | 1/1979 | Japan . |

*Primary Examiner*—James B. Mullins
*Attorney, Agent, or Firm*—Ostrolenk, Faber, Gerb & Soffen

[57] ABSTRACT

A load monitor module for measuring voltage and current supplied from an amplifier to a load is provided within an amplifier and includes a device for calculating an impedance of the load and an amount of power delivered to the load from the amplifier. The load monitor module includes a voltage measuring device and a current measuring device for accurately measuring the voltage and current of a generated test signal or an audio signal input the amplifier signal path without substantially altering the signal. The monitor module also includes a controller for controlling the performance of the amplifier and load according to the calculated load impedance and power input to the load from the amplifier.

36 Claims, 2 Drawing Sheets

INTERNAL LOAD MONITOR FOR AMPLIFIER

This is a Continuation of application Ser. No. 08/336,828, filed on Nov. 9, 1994, now abandoned.

BACKGROUND OF THE INVENTION

1. Field of the Invention

The present invention relates to a device for measuring voltage and current delivered from an amplifier to a load driven by the amplifier and for calculating load impedance and power delivered to the load, and more particularly, to a load monitoring device located within an amplifier for detecting voltage and current to a load driven by an amplifier without significantly affecting the voltage and current being detected to accurately calculate load impedance and power output to the load from the amplifier.

2. Description of the Prior Art

A conventional amplifier, such as the one shown in FIG. 3, typically has a signal path including an input port 12, a power amplifier 14 and an output port 18 connected to a load such as a loudspeaker 20.

It is desirable to monitor the performance of the amplifier 10 and connected loads to maintain a desired operation of the amplifier and load assembly for safety and diagnostic reasons. For example, if the amplifier 10 is provided in an emergency paging network, it is critical that the amplifier 10 remain operational and each load or loudspeaker connected to the amplifier 10 is properly functioning.

A conventional external amplifier testing unit 30 is used to test the operating condition of conventional amplifiers and loads by connecting the testing unit 30 to each amplifier/load assembly. The external testing unit 30 typically comprises a sensing device 34 such as a resistor which can be connected in a signal path of a conventional amplifier 10 as shown in FIG. 3. A plurality of connecting devices 32, such as electrical cables, are used to connect the external testing unit 30 to the amplifier 10.

After the conventional sensing device 34 is connected in the signal path of the amplifier 10 via the cables 32, a test procedure is conducted in which a test signal is generated. The sensing device 34 detects a voltage and current of the test signal traveling from the power amplifier 14 to the loudspeaker 20. The sensing device 34 is connected to the signal path at various points for measuring the voltage and current in the signal path before and after the test signal is sent through the sensing device 34. More specifically, the test unit 30 measures the voltage across the resistor 34 and then calculates the current through the resistor 34 using the known resistance value of the resistor 34. The current through the resistor 34 is the same as the current through the load. Then, the voltage across the load 34 can be calculated using the calculated current.

The test unit 30 calculates an impedance of the load 20 and an amount of power supplied to the load 20 from the amplifier 14 from the measured voltage and current using known equations. By calculating and monitoring the load impedance and power supply, an operator of the test unit 30 can determine if the amplifier 14 and loudspeaker 20 are operating as desired.

Because the test unit 30 is located outside of the amplifier and connected to the signal path at various points, the plurality of electrical cables 32 is required. Also, the cables 32 must be connected and disconnected for each amplifier 10 being tested. In addition, the test unit 30 must be transported to each of the amplifier/load assemblies to be tested even if the load is located in remote areas.

The test unit 30 detects the voltage and current delivered to the load 20 from the amplifier 10 by generating test signals and transmitting the test signals from the test unit 30 to the amplifier input 12, through the power amplifier 14, the sensing resistor 34, and amplifier output 18 to the load 20. Because the sensing device is a resistor 34, the test signal is altered which causes errors to be introduced into the test values. Thus, accurate voltage and current detection is not possible.

The test unit 30 measures the voltage and current of the test signals at a locations before and after the sensing resistor 34 along the signal path. The test unit 30 then calculates the load impedance and power delivered from the amplifier to the load using known operations. The calculated load impedance and delivered power can be displayed to allow a test unit operator to determine if an amplifier and loudspeaker are operating properly.

SUMMARY OF THE INVENTION

There exists a need for a load monitoring device that is provided within an amplifier to measure current and voltage delivered from an amplifier to a load accurately and in a substantially non-intrusive manner.

At least one embodiment of the present invention provides a load monitor module located within an amplifier which overcomes the disadvantages of conventional devices for measuring current and voltage supplied from an amplifier to a load. The present invention provides several advantageous features that allow a load impedance and power delivered to a load from an amplifier to be accurately calculated.

According to at least one embodiment of the present invention, a load monitor module is located within an amplifier and includes a voltage sensing circuit, a current sensing circuit and a calculating and controlling circuit. The calculating and controlling circuit may comprise an analog circuit. The calculating and controlling circuit may also comprise a digital signal processor described in U.S. patent application Ser. No. 08/546,839, now U.S. Pat. No. 5,652,542, which is a continuation application of U.S. patent application Ser. No. 08/336,481, now abandoned, entitled "DIGITAL SIGNAL PROCESSOR FOR AMPLIFIER," filed on Nov. 9, 1994 in the name of the present Applicant, which disclosure is hereby incorporated by reference.

A signal, such as a test signal generated by a signal generator or an audio signal input to the amplifier signal path, is transmitted along the signal path to a load through the voltage sensing circuit and the current sensing circuit for measuring the voltage and current of the signal without substantially affecting or altering the input signal. If the source signal is an input audio signal, digital signal processing techniques are used to compute the impedance of the load while the audio program material is travelling through the signal path. If a test signal is used as the source, a test signal generator may be activated manually, by a program stored in the test signal generator or calculating and controlling circuit or initiated by a computer attached to a network of interconnected amplifiers.

The calculating and controlling circuit calculates delivered power and load impedance as a function of frequency to provide an impedance value at a plurality of different frequencies. The measured values of the current and voltage are input to the internal calculating and controlling circuit where the load impedance and the power delivered to the load are calculated.

Control information can be generated by the calculating and controlling circuit according to the calculated load impedance and delivered power to alter the performance of the amplifier/load assembly. This control information is input to the amplifier to change amplifier performance as desired. For example, if too much power is being put out by the amplifier, a control signal can be sent to the amplifier to reduce the amount of power output.

Also, the control information generated by the calculating and controlling circuit can comprise control signals for modifying at least one of a plurality of amplifier signal processing functions and associated signal processing function parameters. The control information may also be delivered over an entire network of amplifiers via an output port.

It is preferred that the entire load monitor module be provided within a single amplifier chassis and connected internally to various points along the amplifier signal path. Also, it is preferred that the voltage sensing circuit and current sensing circuit are substantially non-intrusive so as to not affect a signal being sent through the sensing circuits. This can be accomplished by using a current sensing transformer in the current sensing circuit and a high impedance operational amplifier in the voltage sensing circuit.

The load monitor module according to at least one embodiment of the present invention provides several advantages over conventional amplifiers and conventional test units. Because the load monitor module of the preferred embodiment of the present invention is provided within an amplifier chassis and connected internally to the amplifier signal path, no external test equipment, connectors, external sensing circuits or external signal generators are required. Instead, load testing can be performed within the amplifier/load assembly by activating an internal test signal generator to generate a test signal and testing this test signal or testing audio signals input to the amplifier signal path.

Also, because the test signal is not substantially altered by the current sensing circuit and the voltage sensing circuit, the detected voltages and currents are accurate. In addition, the load monitor calculates both power to the load and impedance of the load as a function of frequency. Further, if a signal generator is used, the signal generating circuitry is on board the amplifier and does not require connection to an external generator. Also, the load monitor allows for remote testing of inaccessible amplifiers and loads.

Also, in systems where loads are located in remote, inaccessible areas, the load monitor module within the amplifier is able to test a remote amplifier and load assembly without requiring a test operator to access the remote amplifier or load. For example, if a plurality of amplifiers are connected in a network controlled by a computer, a test operator can send a test signal via the computer and the computer will receive the test results to allow the operator to check the amplifier/load assembly.

Moreover, the calculating and controlling circuit of the preferred embodiment can be adapted to compute the load impedance versus frequency using audio program material instead of an externally generated test signal as source. To achieve this advantage, the calculating and controlling circuit uses digital signal processing techniques and allows measurement of amplifier performance during normal operation.

Other features and advantages of the present invention will become apparent from the following description of the invention which refers to the accompanying drawings.

DETAILED DESCRIPTION OF A PREFERRED EMBODIMENT

Figure 1:
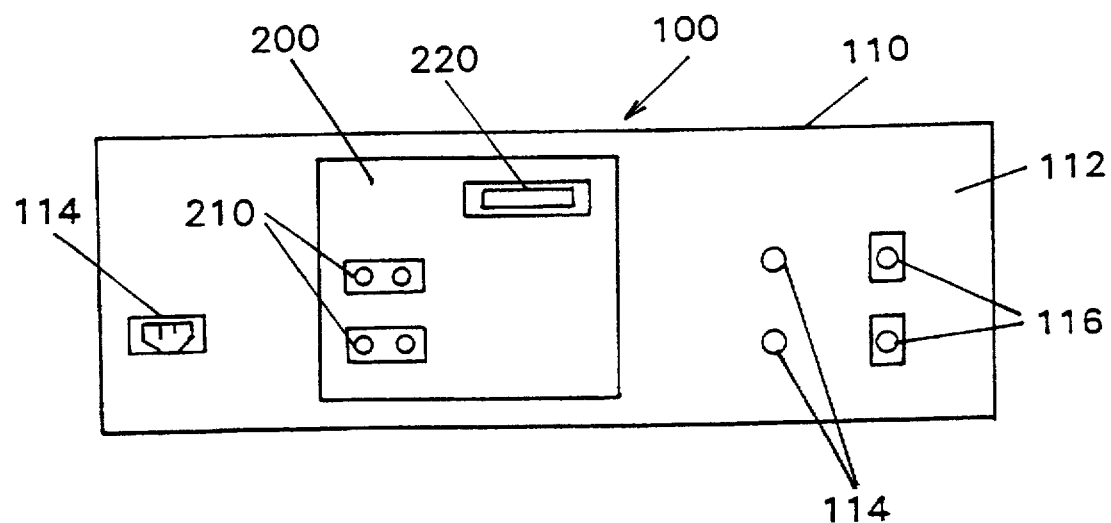
FIG. 1 is a schematic view of an amplifier according to one embodiment of the present invention.

An amplifier 100 according to a preferred embodiment of the present invention is shown in FIG. 1. The amplifier 100 includes an amplifier housing 110 which has an amplifier control panel 112 mounted thereon. The control panel 112 includes a plurality of control knobs 114 for controlling gain, volume, and other amplifier characteristics, as is conventional. The control panel 112 also includes input ports 116 for being connected to at least one input device such as a musical instrument, public address system, etc.

Also provided in the amplifier housing 110 and mounted on the amplifier control panel 112 is a load monitor module 200. The load monitor module 200 includes a plurality of output ports 210 for connection to at least one load 300 (shown in FIG. 2) such as a loudspeaker. The load monitor module also has a load monitoring output port 220 for connection to a plurality of output devices such as a network bus 400 for transmitting calculated load and amplifier performance information along a network.

Figure 2:
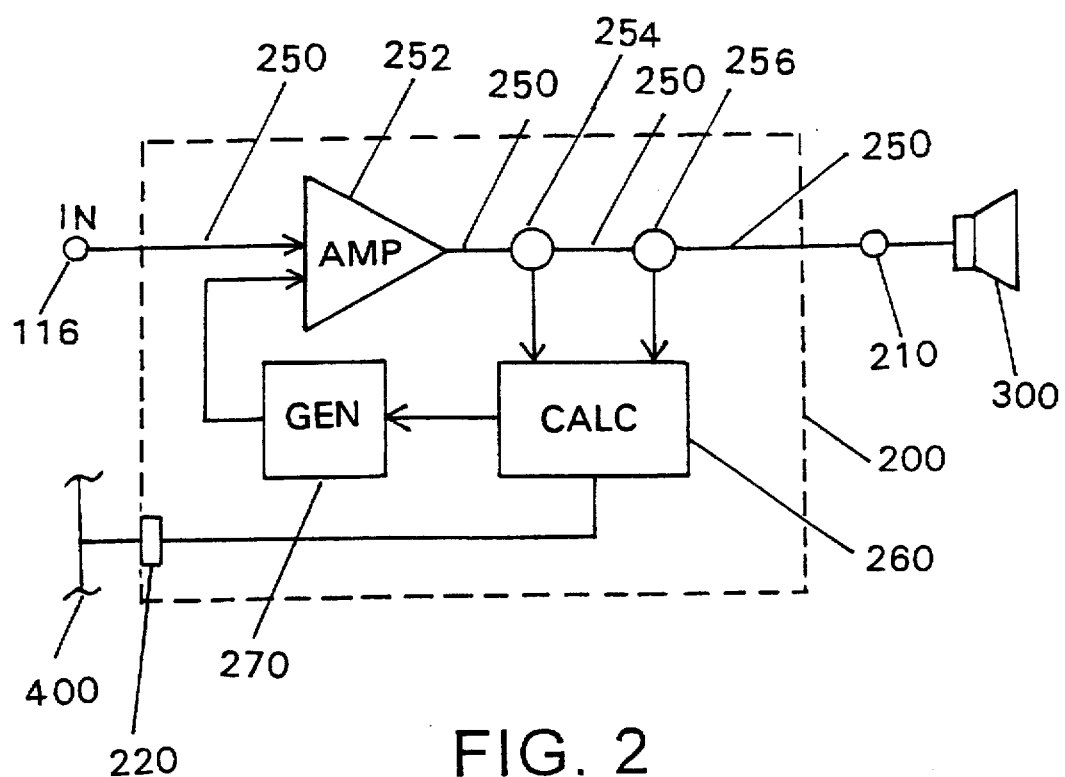
FIG. 2 is a schematic view of an amplifier circuit of the amplifier shown in FIG. 1.
Figure 2A:
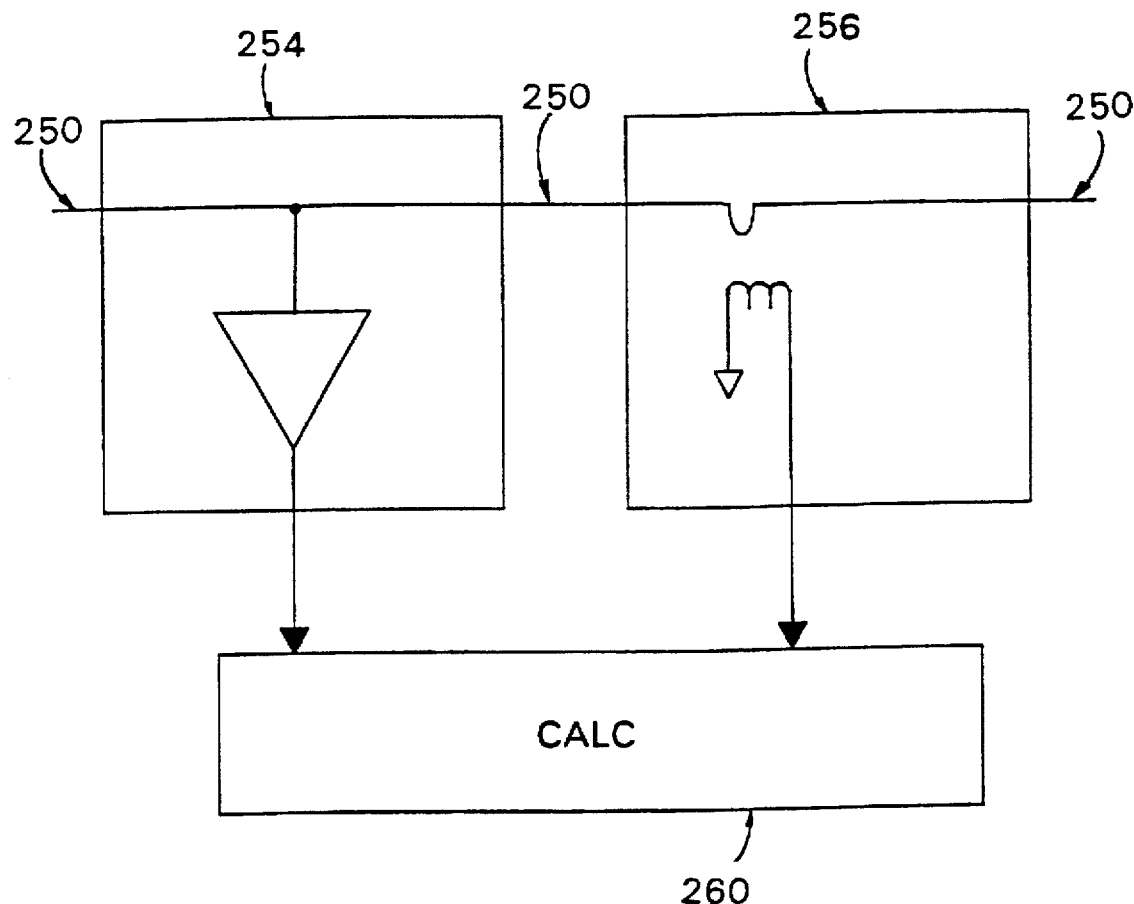
FIG. 2a is a schematic view of preferred circuit components for the voltage detecting circuit and current detecting circuit of the present invention.
Figure 3:
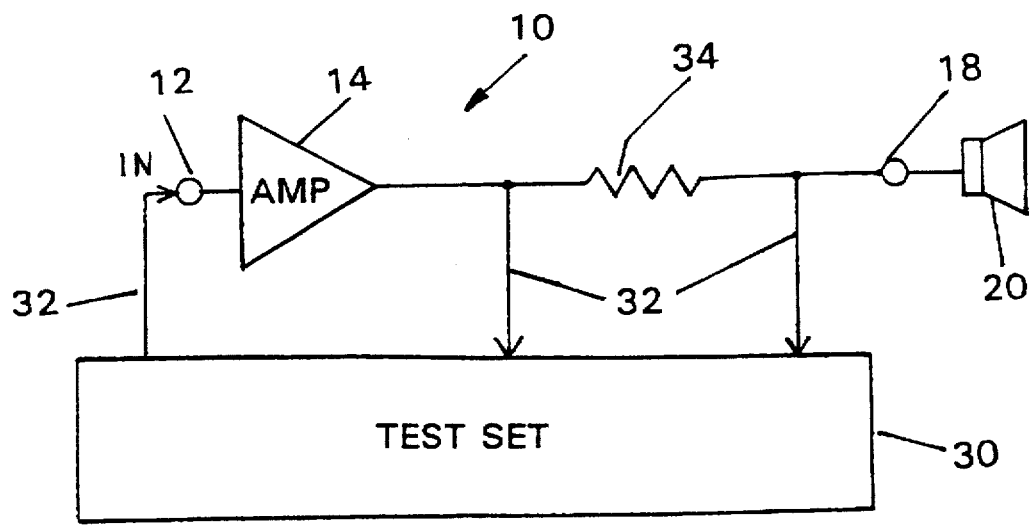
FIG. 3 is a schematic view of a conventional amplifier.

The amplifier signal path and the load monitor module circuit elements are shown in FIG. 2. A main amplifier signal path 250 includes a power amplifier 252, a voltage detecting circuit 254 and a current detecting circuit 256. The voltage detecting circuit 254 preferably includes a high impedance operational amplifier (not shown) for detecting voltage without substantially affecting the input signal. The current detecting circuit 256 preferably includes a current sensing transformer (not shown) for detecting current without substantially affecting input signal.

A calculating and controlling circuit 260 is also provided in the load monitor module 200. The calculating and controlling circuit 260 may comprise an analog device, a programmable microprocessor or other suitable device. The calculating and controlling circuit 260 may also comprise a digital signal processor described in U.S. patent application Ser. No. 08/336,481, as mentioned above.

If desired, a test signal generator 270 may also be provided in the load monitor module 200. The test signal generator 270 is adapted to generate a test signal or a series of test signals according to a desired operation. The test signal generator can be activated by a manually inputted command from a user or by a program stored in the test signal generator 270 or the calculating and controlling circuit 260 for periodically sending out a test signal to monitor the operating conditions of the amplifier and the load. The test signal generator may also be activated by a control signal input from a network bus 400 from a computer controlling a network.

If the amplifier 100 is connected in a network of amplifiers, the load monitoring output port 220 is connected to the calculating and controlling circuit 260 for connection to the network for transmitting calculated load and amplifier performance information along the network. This is especially important in an emergency paging system wherein the operating conditions of each of a plurality of interconnected amplifiers must be sent throughout the network.

The operation of the load monitor module 200 and amplifier 100 will be described in the following paragraphs.

A signal used for testing the voltage and current can either be a test signal generated by the test signal generator 270 or an audio signal input to the input port 116.

The input signal is sent through the power amplifier 252 through the voltage detecting circuit 254 and the current detecting circuit 256 to the loudspeaker 300 via the output node 210. As discussed above, the voltage detecting circuit 254 and the current detecting circuit 256 detect the voltage and current, respectively, without substantially affecting or changing the signal.

The detected voltage and current are sent to the calculating and controlling circuit 260. Using the detected voltage and current, the calculating and controlling circuit 260 calculates an impedance of the loudspeaker 300 and an amount of power delivered to the loudspeaker 300 from the amplifier. The method of calculating the impedance and power is known and does not form part of the present invention. Therefore, description of the calculating method is omitted.

If an input audio signal is used for the source instead of a signal generated by the signal generator 270, the load impedance and power delivered calculation method involves computing the Fourier Transform of the voltage and current sensing signals and using the spectra resulting from the computation of the Fourier Transform to compute the load impedance and power delivered from the amplifier to the load. Preferably, the load impedance and power delivered are computed as a function of signal frequency.

The calculating and controlling circuit 260 uses the calculated load impedance and power supplied to the load to generate control information in the form of analog signals to be sent to the power amplifier 252. As discussed in U.S. patent application Ser. No. 08/336,481, the control signals generated by the calculating and controlling circuit 260 can modify a plurality of signal processing functions and associated function parameters for changing the operation of the amplifier 252 and the sound produced by the loudspeaker 300. In addition, if the calculating and controlling circuit 260 determines that the amplifier 252 is sending too much power to the load 300, control signals can be sent to the amplifier 252 to reduce the power output and thereby prevent damage to the amplifier 252. Also, the calculating and controlling circuit 260 provides for remote monitoring of the loudspeaker output impedance to ensure that the loudspeaker is operating properly.

The calculated load impedance and power output information can also be transmitted via the port 220 and a network bus 400 across an entire network of amplifiers using a computer that is connected to the network. Control signals can be input via the computer and sent over the network to the load monitor module through the network bus 400 and input port 220. This is especially important in large sound systems having a network of interconnected amplifiers 100 which are too numerous and often inaccessible to quickly test for proper functioning.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier comprising:
a power amplifier for driving a load;
a voltage detecting circuit for detecting a voltage of a signal sent through the power amplifier to the load;
a current detecting circuit for detecting a current of the signal sent through the power amplifier to the load; and
a calculating and controlling circuit for receiving a signal corresponding to the detected voltage from the voltage detecting circuit and a signal corresponding to the detected current from the current detecting circuit and calculating the impedance of the load is a function of frequency of the signal.

2. The amplifier of claim 1, wherein the calculating and controlling circuit generates control signals based on the calculated load impedance and sends the control signals to the power amplifier to modify at least one of an amplifier signal processing function and a signal processing function parameter.

3. The amplifier of claim 1, further comprising a test signal generator connected to the power amplifier for generating a test signal and sending the test signal through the power amplifier, the voltage detecting circuit and the current detecting circuit.

4. The amplifier of claim 1, further comprising an amplifier housing for housing the power amplifier, the voltage detecting circuit, the current detecting circuit and the calculating and controlling circuit.

5. The amplifier of claim 1, wherein the calculating and controlling circuit comprises a digital signal processor.

6. The amplifier of claim 1, wherein the voltage detecting circuit includes a high impedance operational amplifier.

7. The amplifier of claim 6, wherein the voltage detecting circuit measures the voltage of the signal sent through the power amplifier to the load without substantially affecting the signal.

8. The amplifier of claim 1, wherein the current detecting circuit includes a current sensing transformer.

9. The amplifier of claim 8, wherein the current detecting circuit measures the current of the signal sent through the power amplifier to the load without substantially affecting the signal.

10. The amplifier of claim 1, wherein the voltage detecting and the current detecting circuit are adapted for detecting a voltage and a current, respectively, of an input audio signal.

11. The amplifier of claim 1, wherein the calculating and controlling circuit calculates the load impedance by taking the ratio of the detected voltage and the detected current at a plurality of discrete frequencies.

12. The amplifier of claim 1, wherein the calculating and controlling circuit calculates the load impedance by taking the Fourier Transform of the detected voltage and the detected current and uses the resulting spectra to compute the load impedance as a function of frequency.

13. An amplifier comprising:
an amplifier housing;
a power amplifier for driving a load;
a voltage detecting circuit for detecting a voltage of a signal sent through the power amplifier to the load;
a current detecting circuit for detecting a current of the signal sent through the power amplifier to the load; and
a calculating and controlling circuit for receiving a signal corresponding to the detected voltage from the voltage detecting circuit and a signal corresponding to the detected current from the current detecting circuit and calculating the amount of power supplied to the load from the power amplifier as a function of frequency.

14. The amplifier of claim 13, further comprising a test signal generator for generating a test signal and sending the test signal through the power amplifier, the voltage detecting circuit and the current detecting circuit.

15. The amplifier of claim 13, wherein the voltage detecting circuit includes a high impedance operational amplifier.

16. The amplifier of claim 13, wherein the current detecting circuit includes a current sensing transformer.

17. The amplifier of claim 13, wherein the voltage detecting circuit measures the voltage of the signal sent through the power amplifier to the load without substantially affecting the signal and the current detecting circuit measures the current of the signal sent through the power amplifier to the load without substantially affecting the signal.

18. The amplifier of claim 13, wherein the signal sent through the power amplifier to the load comprises an audio signal input to the power amplifier.

19. The amplifier of claim 13, wherein the calculating and controlling circuit generates control signals based on the calculated amount of power supplied and sends the control signals to the power amplifier to modify at least one of an amplifier signal processing function and a signal processing function parameter.

20. The amplifier of claim 13, further comprising an output port for outputting the calculated amount of supplied power, to a network of a plurality of interconnected amplifiers.

21. The amplifier of claim 13, wherein the calculating and controlling circuit comprises a digital signal processor.

22. The amplifier of claim 13, wherein the calculating and controlling circuit calculates the power delivered to the load by taking the product of the detected voltage and the detected current at a plurality of discrete frequencies.

23. The amplifier of claim 13, wherein the calculating and controlling circuit calculates the power delivered to the load by taking the Fourier Transform of the detected voltage and the detected current and uses the resulting spectra to compute the power delivered to the load as a function of frequency.

24. An amplifier comprising:
a power amplifier for driving a load;
a voltage detecting circuit for detecting a voltage of a signal sent through the power amplifier to the load;
a current detecting circuit for detecting a current of the signal sent through the power amplifier to the load; and
a calculating and controlling circuit for receiving a signal corresponding to the detected voltage from the voltage detecting circuit and a signal corresponding to the detected current from the current detecting circuit and calculating the impedance of the load; and
an output port for outputting the calculated load impedance to a network of a plurality of interconnected amplifiers.

25. The amplifier of claim 24, wherein the calculating and controlling circuit generates control signals based on the calculated load impedance and sends the control signals to the power amplifier to modify at least one of an amplifier signal processing function and a signal processing function parameter.

26. The amplifier of claim 24, further comprising a test signal generator connected to the power amplifier for generating a test signal and sending the test signal through the power amplifier, the voltage detecting circuit and the current detecting circuit.

27. The amplifier of claim 24, further comprising an amplifier housing for housing the power amplifier, the voltage detecting circuit, the current detecting circuit and the calculating and controlling circuit.

28. The amplifier of claim 24, wherein the calculating and controlling circuit comprises a digital signal processor.

29. The amplifier of claim 24, wherein the voltage detecting circuit includes a high impedance operational amplifier.

30. The amplifier of claim 29, wherein the voltage detecting circuit measures the voltage of the signal sent through the power amplifier to the load without substantially affecting the signal.

31. The amplifier of claim 24, wherein the current detecting circuit includes a current sensing transformer.

32. The amplifier of claim 31, wherein the current detecting circuit measures the current of the signal sent through the power amplifier to the load without substantially affecting the signal.

33. The amplifier of claim 24, wherein the calculating and controlling circuit calculates the load impedance as a function of frequency of the signal.

34. The amplifier of claim 24, wherein the voltage detecting and the current detecting circuit are adapted for detecting a voltage and a current, respectively, of an input audio signal.

35. The amplifier of claim 24, wherein the calculating and controlling circuit calculates the load impedance by taking the ratio of the detected voltage and the detected current at a plurality of discrete frequencies.

36. The amplifier of claim 24, wherein the calculating and controlling circuit calculates the load impedance by taking the Fourier Transform of the detected voltage and the detected current and uses the resulting spectra to compute the load impedance as a function of frequency.

* * * * *